United States Patent
Suda

(10) Patent No.: US 8,352,672 B2
(45) Date of Patent: Jan. 8, 2013

(54) MEMORY SYSTEM WITH NONVOLATILE MEMORY

(75) Inventor: Takaya Suda, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 606 days.

(21) Appl. No.: 12/325,021

(22) Filed: Nov. 28, 2008

(65) Prior Publication Data

US 2009/0150600 A1    Jun. 11, 2009

(30) Foreign Application Priority Data

Nov. 29, 2007   (JP) ................. 2007-308778

(51) Int. Cl.
| | |
|---|---|
| G06F 12/00 | (2006.01) |
| G06F 13/00 | (2006.01) |
| G06F 13/28 | (2006.01) |
| H03M 13/00 | (2006.01) |

(52) U.S. Cl. .................. 711/103; 714/758; 714/E11.04; 711/E12.008

(58) Field of Classification Search .................. 711/103; 714/758

See application file for complete search history.

(56) References Cited

U.S. PATENT DOCUMENTS

| | | | | |
|---|---|---|---|---|
| 5,581,723 | A | * | 12/1996 | Hasbun et al. ................. 711/103 |
| 6,253,281 | B1 | * | 6/2001 | Hall ............................... 711/112 |
| 6,879,528 | B2 | | 4/2005 | Takeuchi et al. |
| 7,057,942 | B2 | | 6/2006 | Suda et al. |
| 2006/0004969 | A1 | | 1/2006 | Suda |
| 2009/0228634 | A1 | * | 9/2009 | Nakamura et al. ............. 711/103 |

FOREIGN PATENT DOCUMENTS

| | | |
|---|---|---|
| JP | 2006-18471 | 1/2006 |
| JP | 2007-11872 | 1/2007 |
| WO | WO 01/16756 A1 | 3/2001 |

OTHER PUBLICATIONS

Japanese Office Action issued May 8, 2012, in Japan Patent Application No. 2007-308778 (with English translation).

\* cited by examiner

*Primary Examiner* — Yaima Campos
*Assistant Examiner* — Craig Goldschmidt
(74) *Attorney, Agent, or Firm* — Oblon, Spivak, McClelland, Maier & Neustadt, L.L.P.

(57) ABSTRACT

A memory system includes a nonvolatile memory having a plurality of data blocks each of which is a unit of data erase and has a plurality of pages, each of the pages being a unit of data write, and a controller which checks whether or not the nonvolatile memory has been affected by power interruption at power-on time and, if the nonvolatile memory has been affected by power interruption, writes data to that first page in a first data block which has not been affected by power interruption.

16 Claims, 8 Drawing Sheets

| Pin No. | Signal |
|---|---|
| Pin 1 | Card detection/Data 3 (DAT3) |
| Pin 2 | Command (CMD) |
| Pin 3 | Vss |
| Pin 4 | Vdd |
| Pin 5 | Clock (CLK) |
| Pin 6 | Vss |
| Pin 7 | Data 0 (DAT0) |
| Pin 8 | Data 1 (DAT1) |
| Pin 9 | Data 2 (DAT2) |

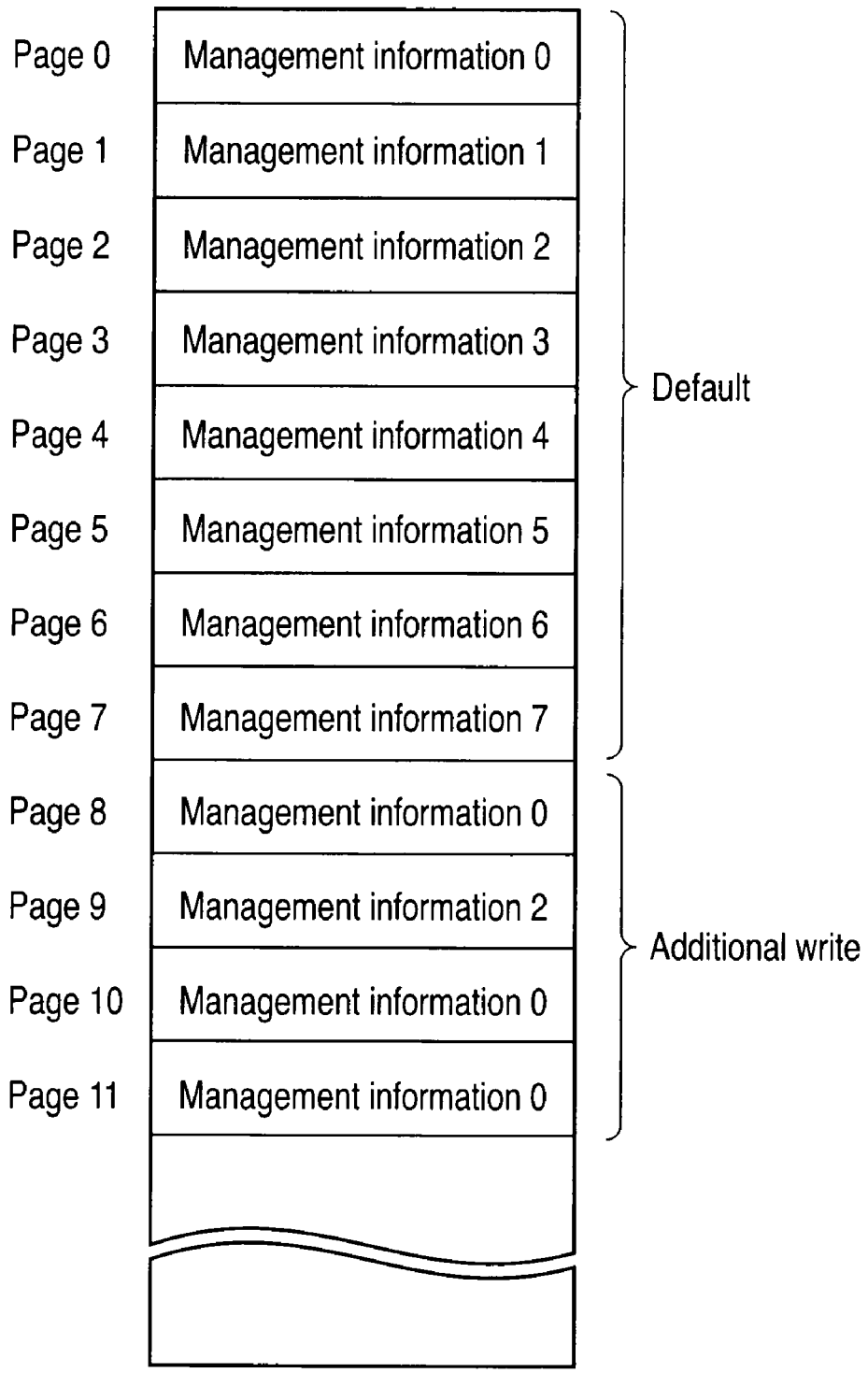
F I G. 8

US 8,352,672 B2

MEMORY SYSTEM WITH NONVOLATILE MEMORY

CROSS-REFERENCE TO RELATED APPLICATIONS

This application is based upon and claims the benefit of priority from prior Japanese Patent Application No. 2007-308778, filed Nov. 29, 2007, the entire contents of which are incorporated herein by reference.

BACKGROUND OF THE INVENTION

1. Field of the Invention

The present invention relates to a memory system and more particularly to a memory system comprising a nonvolatile memory, such as a NAND flash memory.

2. Description of the Related Art

In recent years, as a storage device in portable electronic equipment that manipulates music data, image data, or video data, use has been made of a nonvolatile memory, such as a NAND flash memory. Pieces of portable equipment include cellular phones, digital cameras, and personal digital assistants (PDAs). Such portable equipment is usually battery-powered. For this reason, power interruption may occur, for example, during data writing due to lowering of battery power.

A nonvolatile memory, such as a NAND flash memory, has also been used in universal serial bus (USB) memory for use with a personal computer or the like. Many of the USB memories are structured so that they are readily removable from personal computers. Therefore, users may pull out the USB memory by mistake, for example, during data writing. This may cause power interruption during data writing.

Memory cell transistors that form a NAND flash memory each have a stacked gate structure in which a floating gate electrode to store charges, an intergate insulating film and a control gate electrode are stacked in this order over a semiconductor substrate with a tunnel insulating film interposed therebetween. In writing data into a memory cell transistor, charges are gradually injected into its floating gate electrode to thereby control its threshold voltage. To rewrite data in the NAND flash memory, on the other hand, new data have to be written into the memory after old data have been erased.

With the NAND flash memory having such features, the occurrence of power interruption during the injection of charges will make it impossible to write data into the memory cell transistors at the next activation time. Supposing that data is written into the same memory cell transistor, data integrity will not be obtained.

In the event of occurrence of power interruption during writing, therefore, it is required at the next activation time to prepare a new block in which data have already been erased and then copy data in the old block into the new block. Consequently, the event of rewriting data will occur frequently, which increases overhead and reduces the lifetime of the flash memory which has a limit to the number of times it can be rewritten.

As a related technique, a technique is disclosed which keeps data integrity even when forced interruption occurs while a block is being overwritten (Jpn. Pat. Appln. KOKAI Publication No. 2003-15929).

BRIEF SUMMARY OF THE INVENTION

According to an aspect of the present invention, there is provided a memory system comprising:

a nonvolatile memory having a plurality of data blocks each of which is a unit of data erase and has a plurality of pages, each of the pages being a unit of data write; and a controller which checks whether or not the nonvolatile memory has been affected by power interruption at power-on time and, if the nonvolatile memory has been affected by power interruption, writes data to that first page in a first data block which has not been affected by power interruption.

According to an aspect of the present invention, there is provided a memory system comprising:

a nonvolatile memory having a plurality of data blocks and a management block which stores management information for the data blocks, each of the blocks being a unit of data erase and having a plurality of pages, each of the pages being a unit of data write; and a controller which checks whether or not the nonvolatile memory has been affected by power interruption at power-on time and, if the nonvolatile memory has been affected by power interruption, writes management information to that first page in the management block which has not been affected by power interruption.

BRIEF DESCRIPTION OF THE SEVERAL VIEWS OF THE DRAWING

FIG. 8 is a schematic diagram for use in explanation of a management block stored with management information;

DETAILED DESCRIPTION OF THE INVENTION

Figures 1, 2:
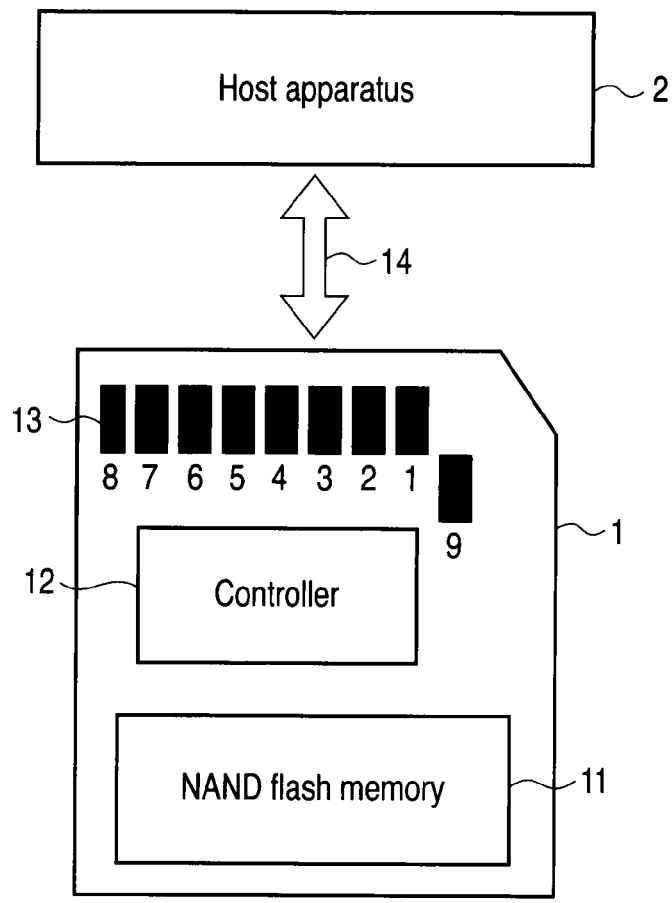
FIG. 1 schematically shows the configuration of a memory card 1 according to a first embodiment of the present invention.
FIG. 2 shows signals assigned to a set of signal pins 13 in FIG. 1.

The embodiments of the present invention will be described hereinafter with reference to the accompanying drawings. In the description which follows, the same or functionally equivalent elements are denoted by the same reference numerals, to thereby simplify the description.

[First Embodiment]

The embodiments will be described taking a memory card as an example of a memory system. The memory card is configured so as to be removably attached to host apparatus. However, the invention is not limited to a memory card, and the memory system and the host apparatus may be formed as a single large-scale integrated circuit (LSI) system. That is, a controller and a nonvolatile semiconductor memory which constitute a memory system may be mounted on a printed circuit board having host apparatus mounted on it.

FIG. 1 schematically shows the configuration of a memory system (memory card) 1 according to a first embodiment of the invention. The memory card 1 is powered when attached to a host apparatus 2 and performs an access process corresponding to a request from the host apparatus. The host apparatus is equipped with software and hardware to access the memory card 1 connected through a bus interface 14 to it.

The memory card 1 sends or receives data to or from the host apparatus 2 via the bus interface 14. The memory card 1 contains a NAND flash memory 11 which is one type of a nonvolatile memory, a controller 12 to control the flash memory, and a set of signal pins (first to ninth pins) 13. Note that the nonvolatile memory is not limited to a NAND flash memory, and various types of nonvolatile memories that conform to the embodiment can be used.

The signal pins 13 are electrically connected to the controller 12. The assignment of signals to the first to ninth pins 13 is as shown in FIG. 2 by way of example. FIG. 2 shows a correspondence between the signal pins and the signals assigned to them.

Data 0 to data 3 are assigned to the seventh, eighth, ninth and first pins, respectively. The first pin is also assigned a card detect signal. The second pin is assigned a command CMD. The third and sixth pins are assigned ground voltage Vss. The fourth pin is assigned supply voltage Vdd and the fifth pin is assigned a clock signal CLK. Thus, the memory card 1 is supplied through the pins with the supply voltage Vdd and the ground voltage Vss from the host apparatus 2.

The memory card 1 is configured so that it can be plugged into the slot of the host apparatus 2 and unplugged. The host controller (not shown) in the host apparatus 2 communicates through the first to ninth pins with the controller 12 in the memory card 1.

For example, in writing data into the memory card 1, the host controller sends a write command through the second pin to the controller 12 as a serial signal. At this point, the controller 12 takes in the write command applied to the second pin using the clock signal CLK applied to the fifth pin. After that, the host controller sends write data to the controller 12 through the seventh, eighth, ninth, and first pins. Thus, the signal pins 13 and the bus interface 14 are used for communication between the host controller in the host apparatus 2 and the memory card 1.

In contrast, communication between the NAND flash memory 11 and the controller 12 is made via interface for the flash memory. Therefore, through not shown, the NAND flash memory 11 and the controller 12 are connected by 8-bit input/output (I/O) lines.

For example, in writing data into the NAND flash memory 11, the controller 12 sequentially inputs a data input command 80H, a column address, a page address, data, and a program command 10H to the NAND flash memory 11 over the I/O lines. Here, "H" in the command 80H indicates hexadecimal. In practice, an 8-bit signal of "10000000" is applied to the eight I/O lines in bit parallel form. That is, with the interface for the NAND flash memory, a command of multiple bits is applied in bit parallel form.

In addition, with the interface for the NAND flash memory, commands and data are sent to the NAND flash memory 11 via the same I/O lines. Thus, the interface for communication between the host controller in the host apparatus 2 and the memory card 1 and the interface for communication between the NAND flash memory 11 and the controller 12 differ from each other.

Figure 3:
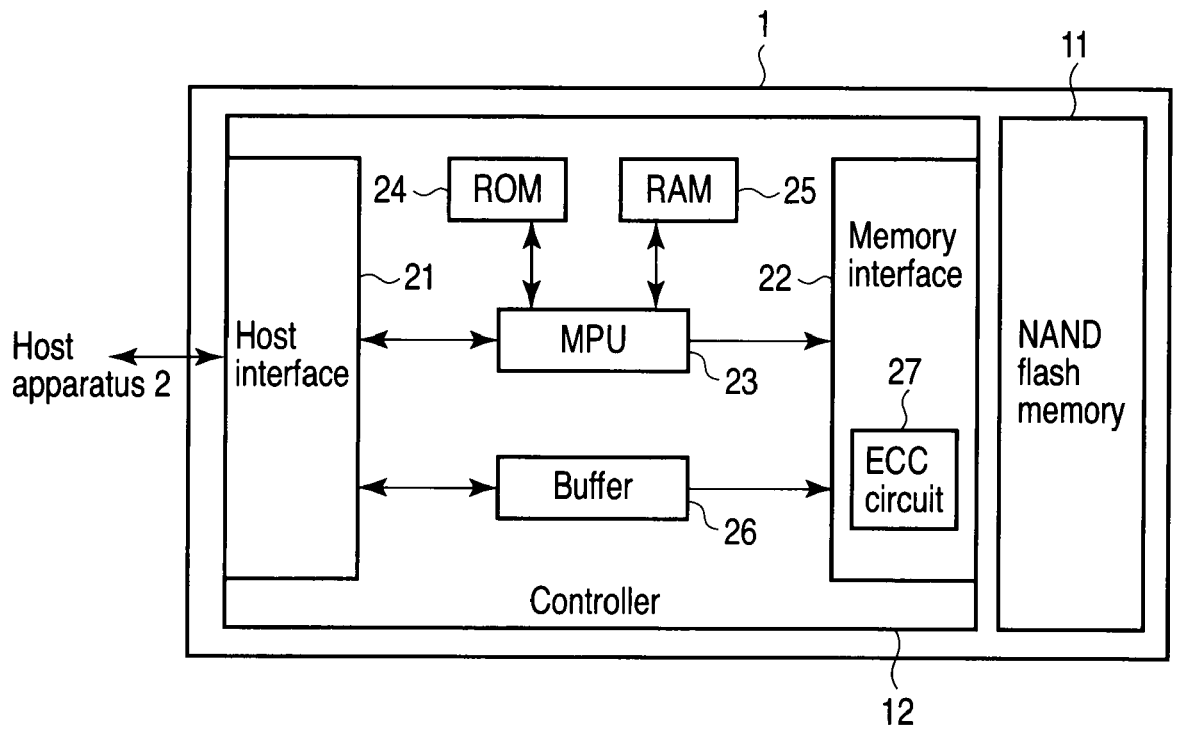
FIG. 3 is a block diagram of the controller 12 shown in FIG. 1.

Next, the internal configuration of the controller 12 in the memory card 1 shown in FIG. 1 will be described. FIG. 3 is a block diagram of the controller 12.

The controller 12 controls the internal physical conditions of the NAND flash memory 11 (for example, which physical block address contains which logical sector address data or which blocks are in the erased state). The controller 12 is equipped with a host interface circuit (host interface) 21, a memory interface circuit (memory interface) 22, a microprocessor unit (MPU) 23, a read-only memory (ROM) 24, a random access memory (RAM) 23, a buffer 26, and an error checking and correction (ECC) circuit 27.

The host interface circuit 21 carries out interface processing between the controller 12 and the host apparatus 2 in accordance with a given protocol.

The MPU 23 controls the operation of the entire memory card 1. For example, when the memory card 1 is powered, the MPU 23 reads firmware (control program) stored in the ROM 24 into the RAM 25 and then carries out given processing to thereby create various tables in the RAM 25. In addition, the MPU 23 receives a write command, a read command, an erase command, or the like to perform given processing on the NAND flash memory 11 or controls data transfer processing via the buffer 26.

The ROM 24 stores a control program executed by the MPU 23. The RAM 25 is used as the working area of the MPU 23 to store the control program loaded from the ROM 24 and various tables. The memory interface circuit 22 performs interface processing between the controller 12 and the NAND flash memory 11 in accordance with a given protocol.

The buffer 26 temporarily stores a constant amount of data based on host interface in writing data sent from the host apparatus 2 into the NAND flash memory 11 or a constant amount data in sending data read from the NAND flash memory to the host apparatus.

The ECC circuit 27 produces an error correction code for each data portion consisting of a predetermined number of bits of write data sent from the host apparatus 2. Each of the resulting error correction codes is stored in the NAND flash memory 11 together with the corresponding data portion. In addition, the ECC circuit 27 performs error detection and correction on read data from the NAND flash memory 11 using the error correction codes for each data portion. After error correction, the ECC circuit sends data to the buffer 26 with the error correction codes removed. Therefore, the host apparatus 2 is allowed to receive read data containing no error correction code from the memory card 1.

The NAND flash memory 11 has a plurality of blocks each of which is a data erase unit. Each block is comprised of a plurality of pages each of which is a data write unit (or a data read unit).

Each block has a plurality of NAND strings arranged in order along the row direction. Each NAND string is composed of two select transistors and a plurality of memory cell transistors connected in series between the select transistors.

Each memory cell transistor is comprised of a metal oxide semiconductor field-effect transistor (MOSFET) having a stacked gate structure formed on a semiconductor substrate.

The stacked gate structure includes a charge storage layer (floating gate electrode) formed over the semiconductor substrate with a gate insulating film interposed therebetween and a control gate electrode formed over the charge storage layer with an intergate insulating film interposed therebetween. Each memory cell transistor has its threshold voltage Vth varied according to the number of electrons stored on the floating gate electrode and stores data according to the varying threshold voltage.

In each block, the control gate electrodes of memory cell transistors arranged in the same row are connected together to the same word line. A plurality of memory cell transistors connected to the same word line is handled as one page. Data write and read operations are performed on a page-by-page basis. Each block is composed of a plurality of pages and data are erased on a block-by-block basis.

The NAND flash memory 11 cannot perform rewriting on a page-by-page basis and has to carry out writing after erasing the entire block. In writing data into the flash memory, therefore, there occurs control to prepare a block already erased and copy a page to be rewritten and data which are not to be rewritten within the block into the prepared block. That is, there occurs a process of copying data into a new block.

Since such control is performed, a block is not uniquely identified by a block address issued by the host apparatus 2. Block addresses issued and managed by the host apparatus are referred to as logical block addresses. Actual block addresses on the NAND flash memory side are referred to as physical block addresses.

Thus, the logical block addresses and the physical block addresses do not match. A logical block address is converted to a physical block address through the use of a address conversion table on the memory card side and a block to be actually accessed is then identified on the basis of the physical block address.

When data is rewritten, data after rewriting is written into a block different from the block prior to rewriting; thus, the correspondence between a logical block address and a physical block address corresponding to that logical block address changes dynamically each time data is rewritten. Therefore, each time data is rewritten, the address conversion table has its portions associated with the rewriting updated.

Figure 4:
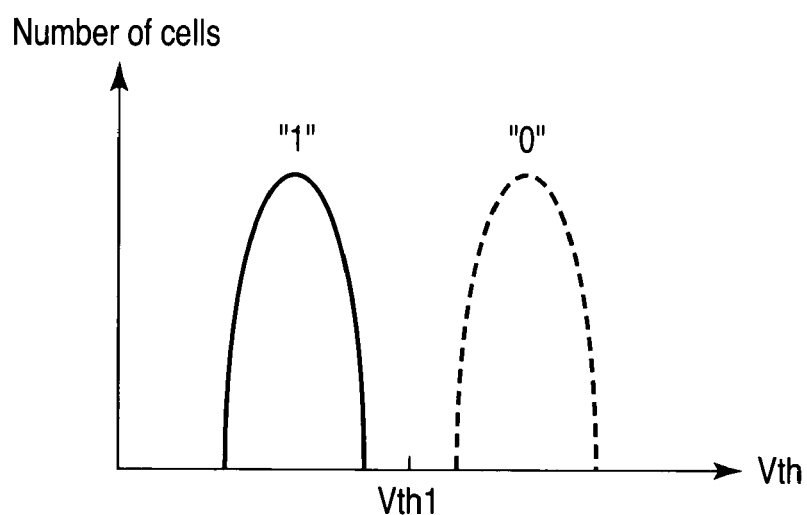
FIG. 4 shows threshold distributions of memory cell transistors.

FIG. 4 shows threshold voltage distributions of a memory cell transistor. In the diagram, the threshold voltage Vth is shown on the horizontal axis and the number of memory cell transistors is shown on the vertical axis. Hereinafter, a description is given of an example of one memory cell transistor storing one bit of data. However, this is not restrictive. One memory cell transistor may be a multilevel memory to store more than one bit of data.

The memory cell transistor stores data by injecting charges into its floating gate electrode to thereby raising its threshold voltage Vth. As shown in FIG. 4, a memory cell transistor to store data of "1" is in the state where no charges are injected (the erased state) and its threshold voltage is lower than a given threshold voltage Vth1. On the other hand, a memory cell transistor to store data of "0" is in the state where charges have been injected (the written state) and its threshold voltage is higher than Vth1. That is, to write data of "1" into a memory cell transistor, it is controlled so that its floating gate electrode is not injected with charges (kept in the erased state). To write data of "0" into a memory cell transistor, on the other hand, charges are injected into its floating gate electrode (the transistor is set to the written state). In this way, the memory cell transistor can be stored with data of "1" or "0".

Figure 5:
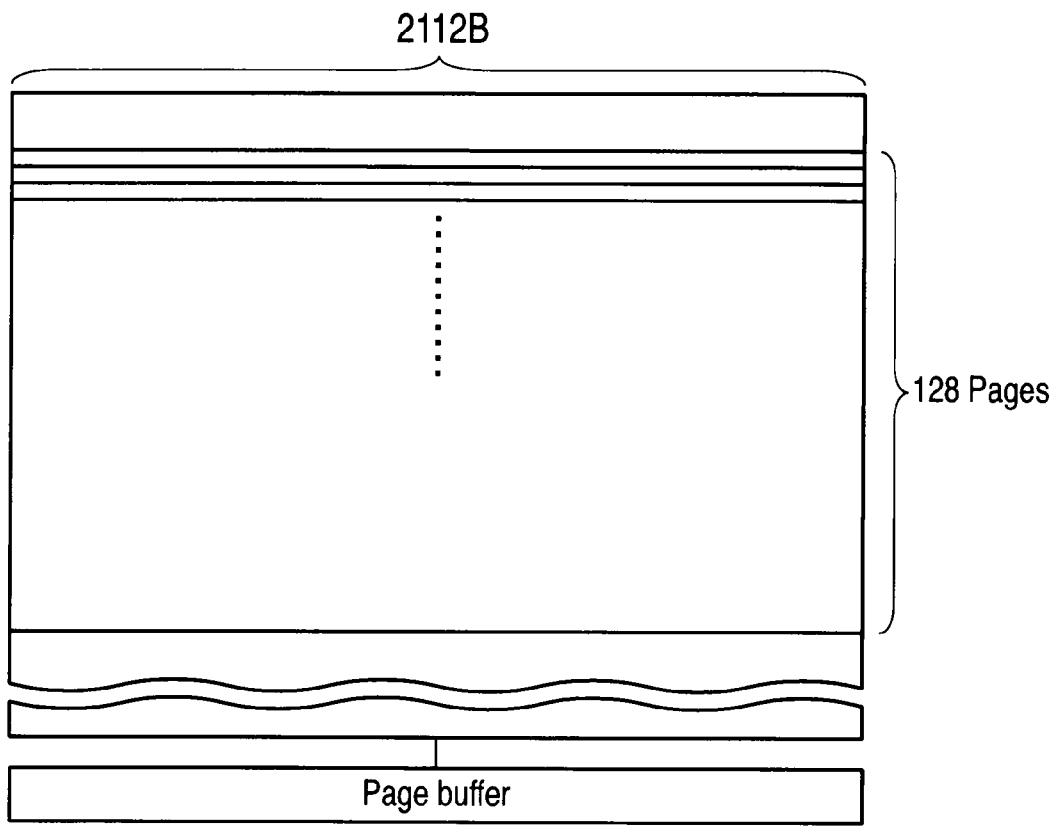
FIG. 5 schematically shows the configuration of the storage area of the NAND flash memory 11 shown in FIG. 1.

FIG. 5 schematically shows the configuration of the storage area of the NAND flash memory 11. Each page has, for example, 2112 bytes (B) (four 512-byte data areas+four 10-byte ECC areas+a 24-byte management data area). For example, 128 pages form a block (256 kB+8 kB (k=1024)) which is a unit of data erase. The NAND flash memory 11 is equipped with a page buffer which holds data on a page basis. In this embodiment, the storage capacity of the page buffer is 2112 bytes (2048 bytes+64 bytes).

Figure 6:
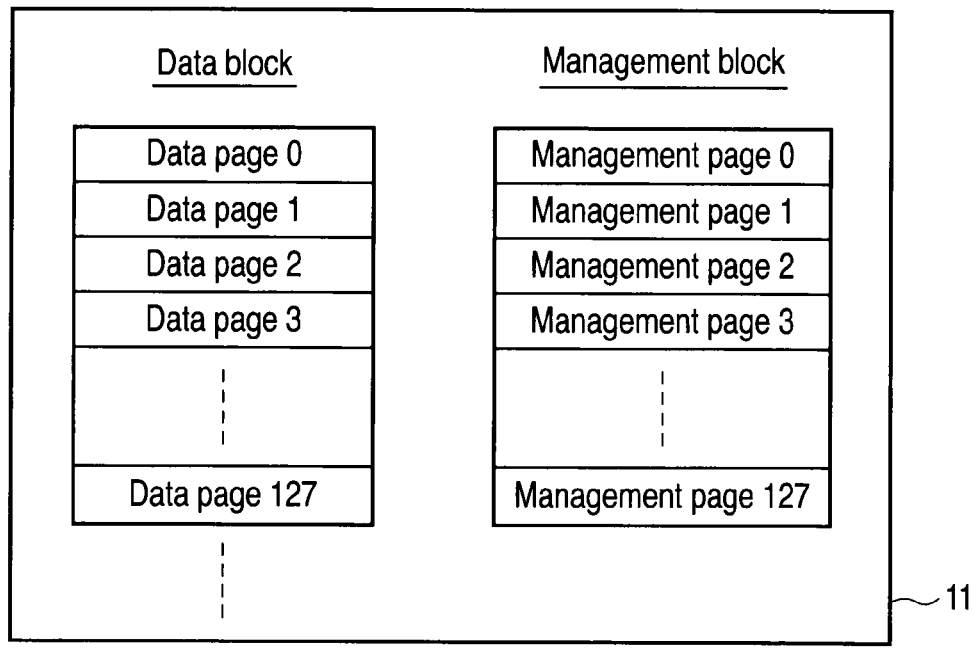
FIG. 6 is a schematic diagram for use in explanation of data blocks and a management block contained in the NAND flash memory 11.

The NAND flash memory 11 has data blocks and a management block. FIG. 6 is a schematic diagram for use in explanation of the data and management blocks contained in the NAND flash memory 11.

A plurality of data blocks is present in the NAND flash memory 11 and used to store user data, such as user-readable documents, still images, moving images, etc. That is, the data blocks form a user data area.

Each data block is composed of 128 data pages 0 to 127. Each data page contains four data areas each storing 512 bytes of data and four ECC areas each of 10 bytes. Each of the ECC areas corresponds to a respective one of the four data blocks and stores an error correction code. The last data area (the fourth data area) in each data page is followed by a 24-byte management data area. For this reason, the last ECC area (the fourth ECC area) in each data page is associated with both the fourth data area and the management data area. The management data area of each page is stored with that management data for the page which contain logical and physical block addresses.

The management block is comprised of a plurality of management pages (say, 128 pages 0 to 127). The management block is a special block that collectively stores various pieces of management information concerning the NAND flash memory 11. The management information cannot be basically read and written by the user and is used by the host apparatus 2 or the controller 12 at the activation of the NAND flash memory 11.

The management block is stored, in addition to the aforementioned address conversion table, with management information for each data block indicating whether or not it is an error-containing block (bad block) or whether or not it is a free block. This management information is updated frequently and hence updated management information is frequently written to the management block.

Increasing the storage capacity of the NAND flash memory 11 results in an increase in the data amount of management information for managing each block. For this reason, to reduce the data transfer time, the user data area composed of multiple data blocks is managed divided into a number of subareas. In this embodiment, as an example, the storage capacity of the NAND flash memory 11 is 8 gigabytes (GB) and the 8-GB area is divided into subareas each of 1 GB. The management information is recorded in the management block in units of the subareas.

Figure 7:
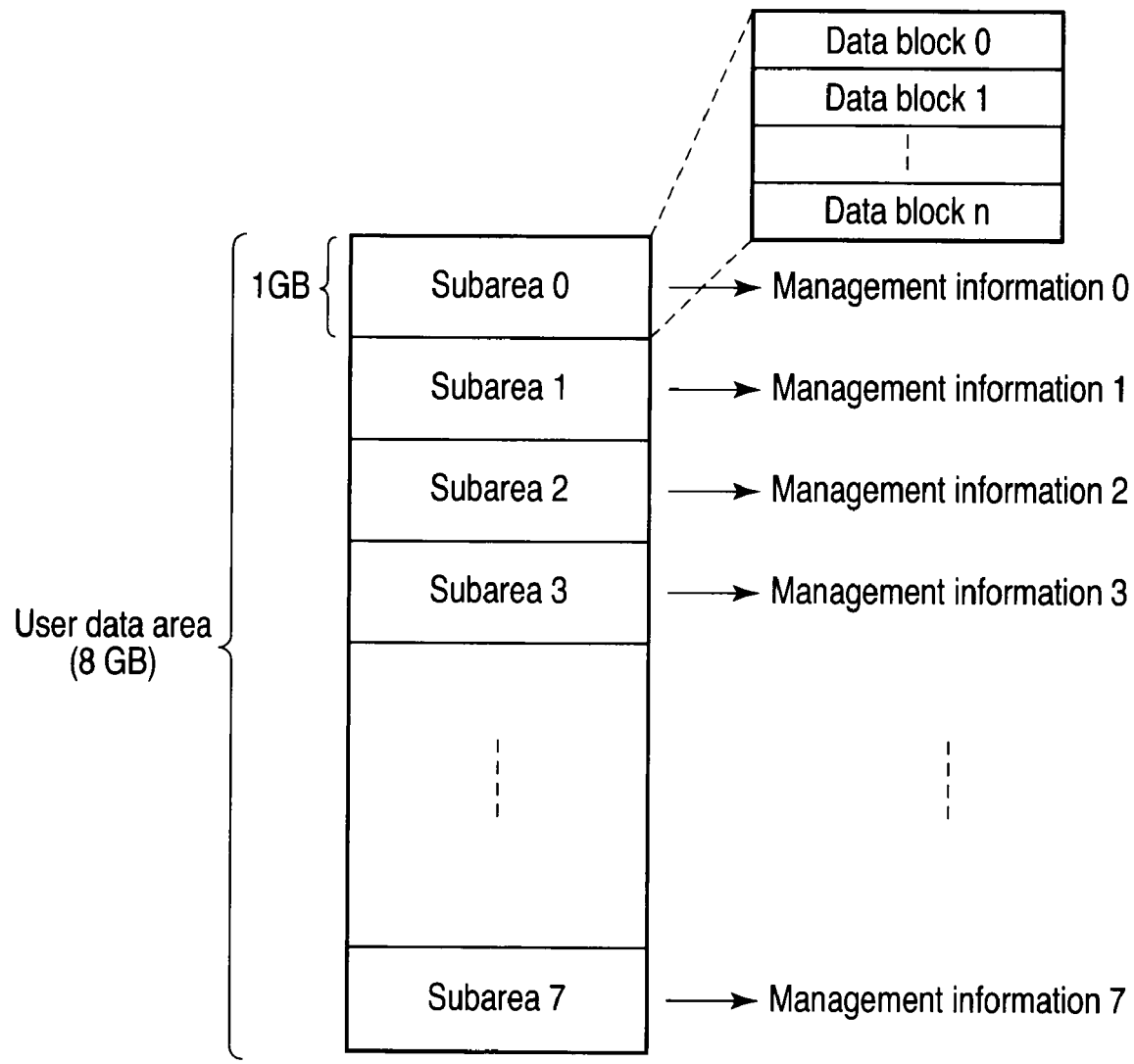
FIG. 7 schematically shows the configuration of the user data area.

FIG. 7 is a schematic diagram illustrating the configuration of the user data area. The user data area is made up of eight subareas 0 to 7 each having a storage capacity of 1 GB. Each of the subareas 0 to 7 is composed of a plurality of data blocks. The subareas 0 to 7 are managed using management information 0 to 7, respectively. Each management information is stored in a management page contained in the management block.

FIG. 8 schematically shows the management block stored with management information. For example, as default, the management pages 0 to 7 are stored with management information 0 to 7, respectively. Each time rewriting of data occurs within the user data area, management information for an area containing a physical address where data rewriting has occurred is updated and the updated management information is additionally written (appended) to the management block. Assume that data rewriting has been performed in the order of subarea 0, subarea 2, subarea 0 and subarea 0 in the user data area. Then, as shown in FIG. 8, management information 0, management information 2, management information 0 and management information 0 are sequentially written to pages 8 to 11 in the management block.

Figure 9:
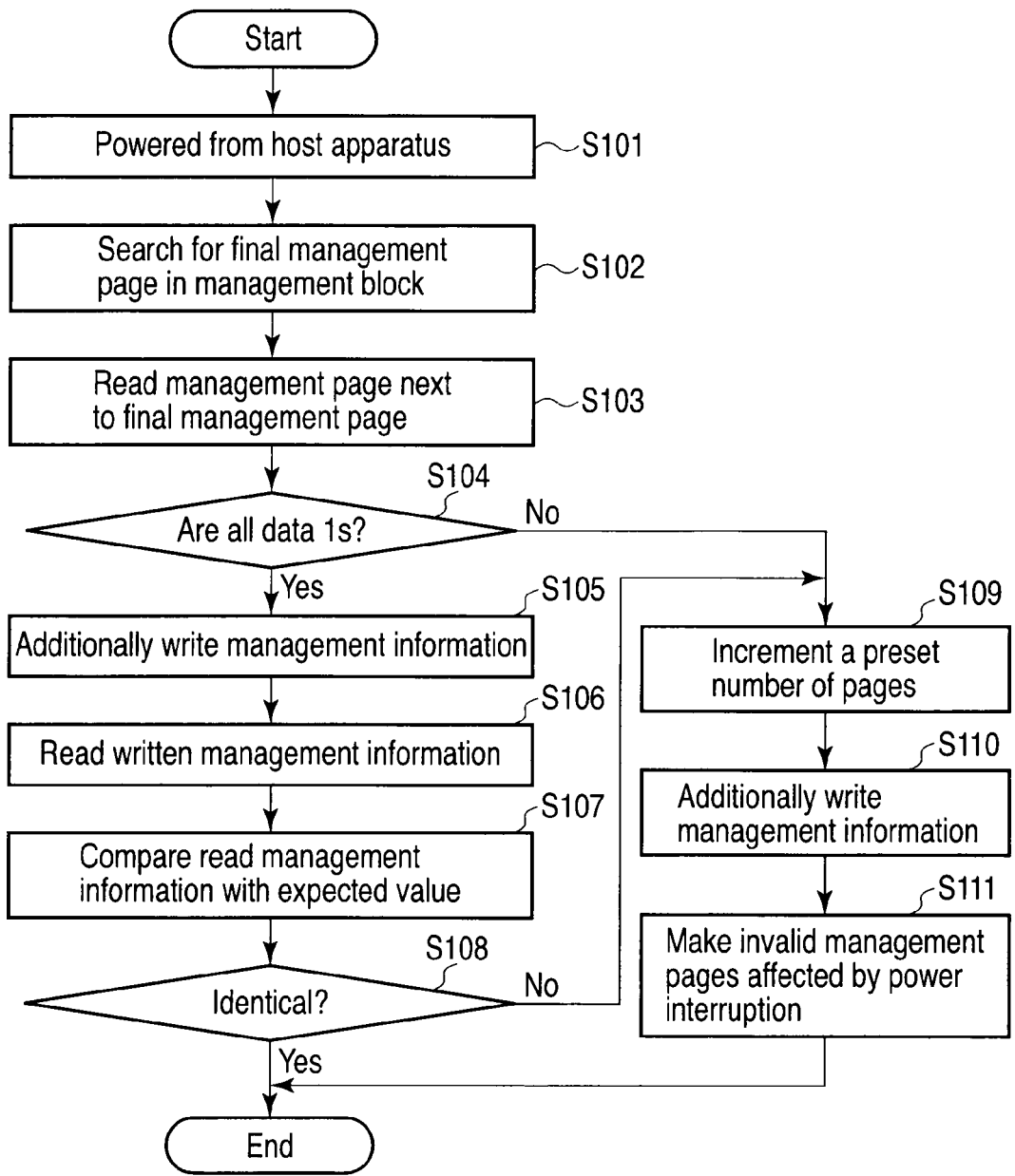
FIG. 9 is a flowchart illustrating the operation of the controller 12 shown in FIG. 1.

Next, the operation of the memory card 1 thus configured will be described. FIG. 9 is a flowchart illustrating the operation of the memory card 1 (specifically, the controller 12).

When powered from the host apparatus 2, the memory card 1 is activated (step S101). When the memory card is activated, the controller 12 searches through the management pages in the management block for the page (the final management page) which was finally written to at the last power-on time (step S102). The search method involves performing error detection on each management page in the management block using the ECC circuit 27 and determining the most significant one of the management pages in which no error has been detected to be the final management page. The most significant page is a page which has the most significant address.

Subsequently, the controller 12 reads all data from the management page next to the final management page (step S103). Then, the controller 12 makes a decision of whether or not all data in the management page next to the final management page are 1s, that is, whether or not the management page next to the final management page is in the erased state (step S104).

If the decision in step S104 is that all data are 1s, then the controller 12 determines that there is no influence of the last power interruption on the NAND flash memory 11. The influence of power interruption on the NAND flash memory 11 is determined by making a decision of whether or not a management page which is a candidate for determination of the influence of power interruption (the management page next to the final management page) can be correctly written to.

That is, when power interruption occurs while data are being written to a certain management page or when the memory card 1 is drawn out of the host apparatus 2 in the power-on state, the threshold voltage Vth of some memory cell transistors has been higher than Vth1 and consequently they are determined to store 0s. Unless the entire management block is erased collectively, these memory cell transistors cannot be returned to the erased state. For this reason, 1s cannot be written into these transistors. Accordingly, data will not be correctly written to management pages affected by power interruption.

If the determination in step S104 is that there is no influence of power interruption, then the controller 12 writes updated management information to the next management page to the final management page (step S105). Subsequently, the controller 12 verifies the written management information. That is, the controller 12 reads the management information written to the next management page to the final management page (step S106) and then compares the read management information with actually updated management information (an expected value) (step S107).

When the result of the comparison in step S107 indicates that the read management information is identical to the expected value (YES in step S108), the updated management information is determined to have been correctly stored in the management block. After that, each time management information is updated, the controller 12 additionally writes the updated management information to the management block.

On the other hand, if the decision in step S104 is that data are not all 1s, or if the decision in step S108 is that the management information is not identical to the expected value, the controller 12 determines that the NAND flash memory 11 has been affected by the last power interruption and then increments (increases) a preset number of pages starting with the management page next to the final management page (step S109). Subsequently, the controller writes the updated management information to the incremented management page (step S110).

The preset number of pages is at least one page where the memory cell transistors are each adapted to store one bit of data. To avoid the influence of power interruption with certainty, the preset number of pages is set to two or more. If the memory cell transistors are each adapted to store two bits of data by way of example, on the other hand, the preset number of pages is at least two pages (upper page and lower page). To avoid the influence of power interruption with certainty, the preset number of pages is set to four or more.

The controller 12 then makes invalid management pages affected by power interruption, that is, management pages between the final management page and the management page after increment (step S111). To invalidate the management pages, in this embodiment, an area to store a 1-bit invalidation flag (invalidation flag area) is set up in each management page.

Figure 10:
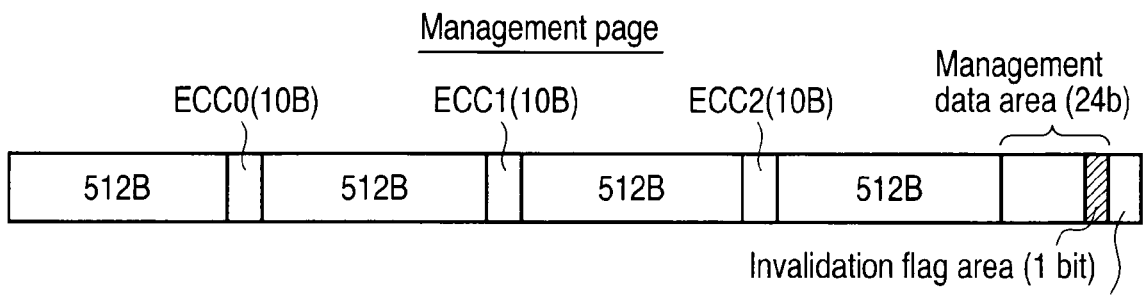
FIG. 10 shows the configuration of a management page having an invalidation flag area.

FIG. 10 shows the configuration of a management page having the invalidation flag area. As described above, each management page in the management block has, say, 2112 bytes and contains four data areas and four ECC areas each corresponding to a respective one of the four data areas. In addition, a 24-byte management data area is set up to follow the last data area (the fourth data area) in the management page.

In this embodiment, each management page is provided with a 1-bit area to store an invalidation flag within the management data area. The controller 12 sets the invalidation flag in a management page to be invalidated. That is, a management page affected by power interruption is invalidated by storing a 1 in its invalidation flag area. After that, the control 12 refers to the invalidation flags so as not to use data in management pages which have been invalidated. For example, the controller 12 creates an invalid-page table in the RAM 25 by referring to the invalidation flags and performs data read operations through the use of that table.

After that, each time management information is updated, the controller writes the updated management information to the management block.

According to this embodiment, as described above, the influence or non-influence of power interruption on the NAND flash memory 11 is first determined by confirming data in the management block upon application of power. Then, even under the influence of power interruption, the current management block is used as it is without moving data. That is, the number of management pages affected by power interruption is incremented starting with the management page which was finally written to at the last power-on time (the final management page) and then updated management information is written to a management page after increment (management page which has not been affected by power interruption).

According to the present embodiment, therefore, even under the influence of power interruption, the need of copying data in the management block to a new block already erased is eliminated, thus allowing the number of times rewriting is carried out to be reduced. Consequently, the lifetime of the NAND flash memory can be increased. Furthermore, the time taken to copy management block data (overhead) can be reduced, thus allowing the operating load on the memory card 1 to be decreased.

In addition, verification of written management information is made. That is, even with management pages once determined to have not been affected by power interruption, the correctness of data is confirmed again. Thereby, the reliability of data can be increased.

Moreover, management pages affected by power interruption are invalidated. After that, these management pages are not used and no read operation is performed on these pages. Thereby, management information can be read correctly and quickly from the management block. In addition, useless read operations can be saved.

[Second Embodiment]

The second embodiment is directed to another method to invalidate management pages affected by power interruption. As another way to invalidate management pages affected by power interruption, a table of management pages to be invalidated may be created and stored in a separate storage area besides the aforementioned way that employs invalidation flags.

Figure 11:
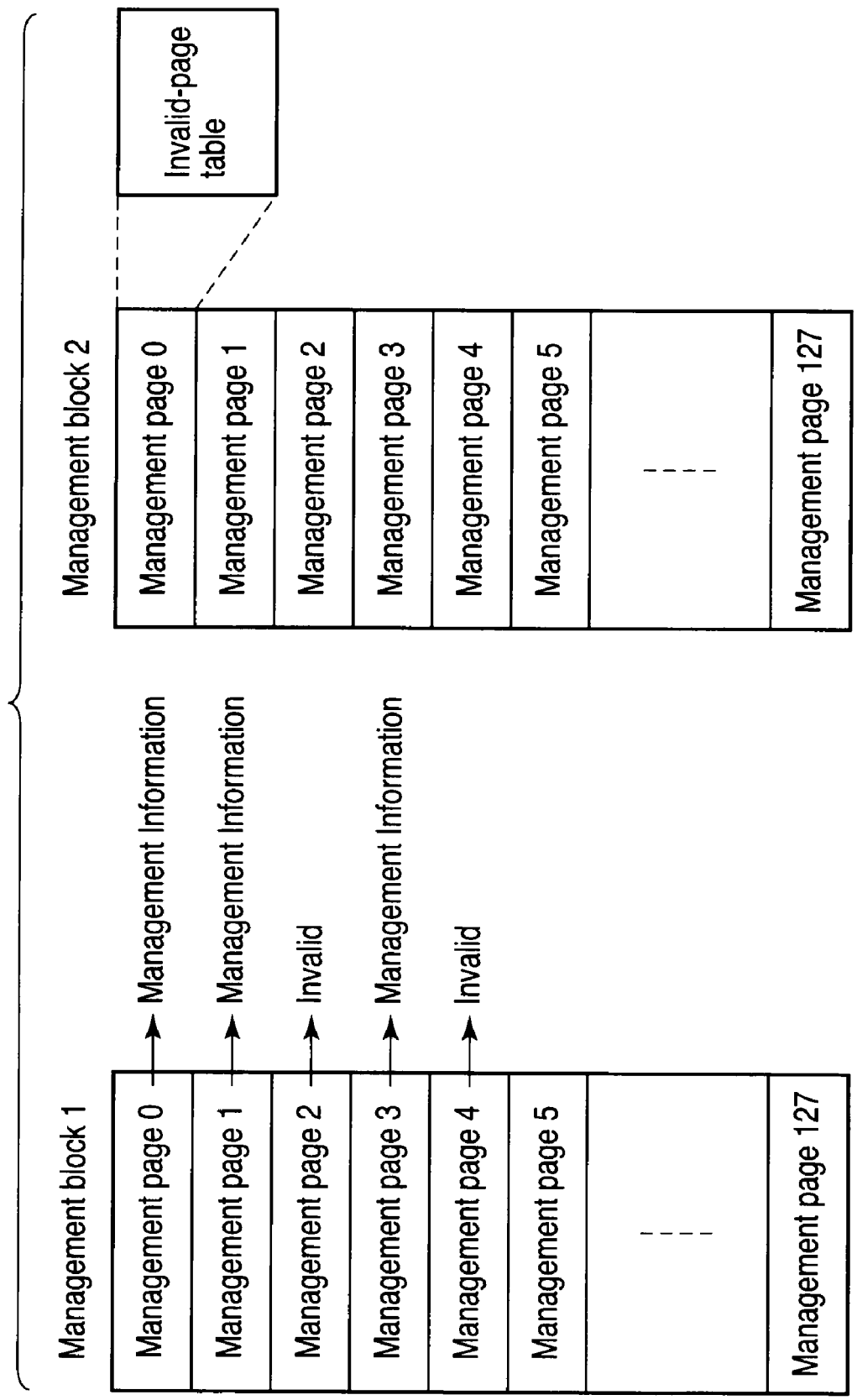
FIG. 11 schematically shows a configuration of a management block according to a second embodiment of the invention.

FIG. 11 schematically shows the configuration of management blocks according to the second embodiment of the present invention. The NAND flash memory 11 has two management blocks (management block 1 and management block 2). Each management block is composed of, say, 128 management pages 0 to 127.

Like the management block in the first embodiment, management block 1, each time management information is updated, stores the updated management information. Unlike the first embodiment, management block 1 of FIG. 11 has no invalidation flag area. Assume that, in step S111 of FIG. 9, management pages affected by power interruption, i.e., management pages which have been invalidated, are management page 2 and management page 4 as shown in FIG. 11.

Then, the controller 12 creates an invalid-page table indicating that management pages 2 and 4 in management block 1 are invalid. The controller then writes that table to, for example, management page 0 in management block 2. Each time a management page is invalidated, the invalid-page table is updated and the updated table is additionally written to the management block. After that, the controller 12 refers to the invalid-page table so as not to make use of data in the invalidated management pages.

Figure 12:
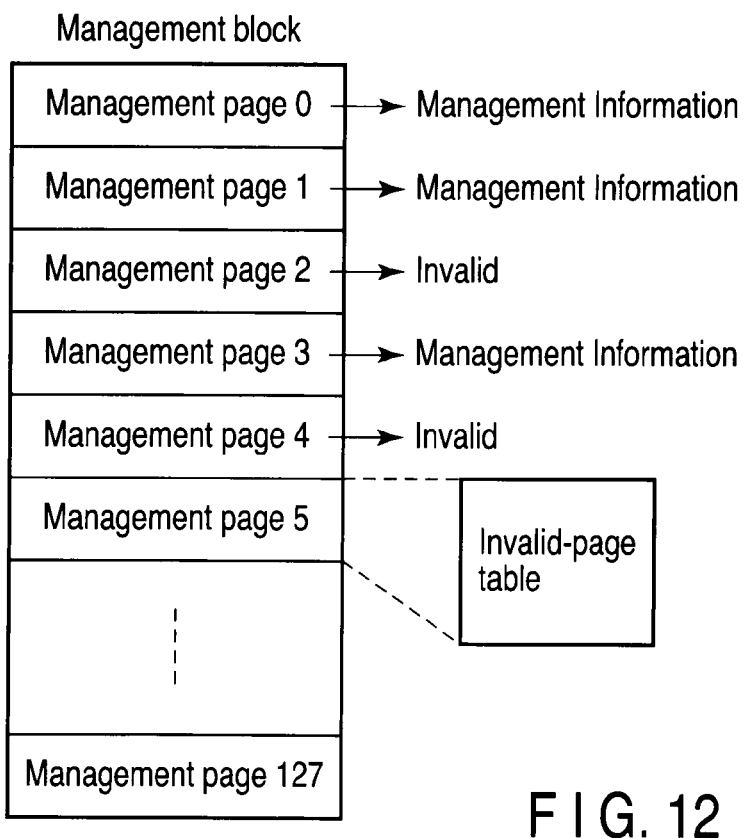
FIG. 12 schematically shows another configuration of the management block according to the second embodiment.

As still another way to invalidate management pages affected by power interruption, the invalid-page table may be stored in the management block that stores management information. FIG. 12 schematically shows another configuration of the management block according to the second embodiment.

The NAND flash memory 11 has one management block. Like the management block in the first embodiment, the management block, each time management information is updated, stores the updated management information. Unlike the first embodiment, management block 1 in FIG. 12 has no invalidation flag area. Suppose that, in step S111 of FIG. 9, management pages affected by power interruption, i.e., invalidated management pages are management pages 2 and 4 as shown in FIG. 12.

Then, the controller 12 creates an invalid-page table indicating that management pages 2 and 4 in management block 1 are invalid. The controller then additionally writes that table to the management block. In the example of FIG. 12, the invalid-page table is stored in the management page 5. Each time a management page is invalidated, the invalid-page table is updated and the updated table is additionally written to the management block. After that, the controller 12 refers to the invalid-page table so as not to make use of data in the invalidated management pages.

According to the second embodiment, as described above, management pages affected by power interruption are not used and no read operation is performed on these management pages. Thereby, management information can be read correctly and quickly from the management block. In addition, useless read operations can be saved.

Although the embodiments have been described in terms of the method of storing management information, the principles of the invention are also readily applicable to data other than management information.

For example, US 2006/0004969 (Jpn. Pat. Appln. KOKAI Publication No. 2006-18471) discloses an operation of rewriting usual data (user data). In this publication, when data in page 1C in block C shown in FIG. 3 is updated, the updated data is additionally written to block E without rewriting block C. That is, in the event that the influence of power interruption has occurred, it is required to prepare a new block already erased and copy data in block E into the new block. The invention is applied to such a configuration to reduce copy processing. Specifically, the following control is carried out.

Figure 13:
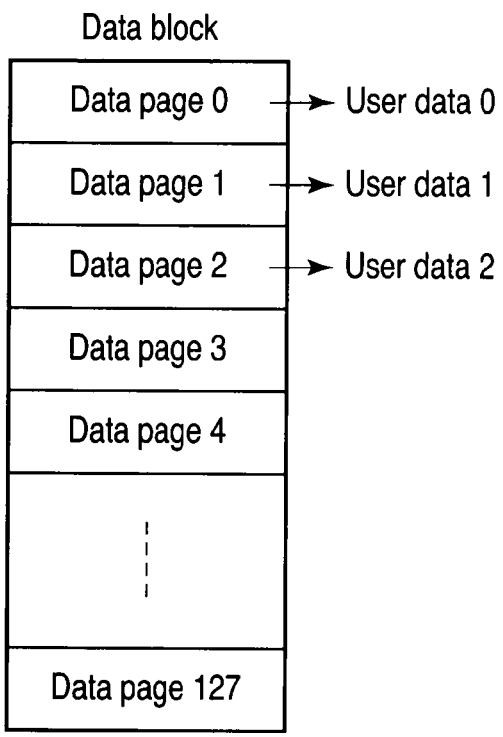
FIG. 13 is a schematic diagram of a data block illustrating another embodiment of the invention.
Figure 14:
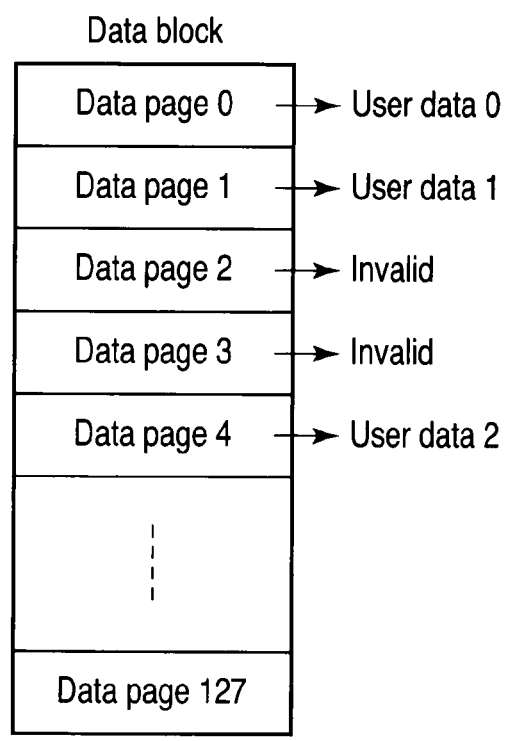
FIG. 14 is a schematic diagram of a data block illustrating still another embodiment of the invention.

As shown in FIG. 13, data page 0 and data page 1 in an arbitrary data block in the NAND flash memory 11 have been stored with user data 0 and user data 1, respectively. Suppose that power is interrupted during writing of user data 2 to data page 2. In that event, the controller 12 makes invalid the last data page 2, which was lastly written to at the last power-on time and affected by power interruption, and the incremented data page 3. After that, the controller additionally writes new user data to data pages starting with data page 4.

Even under the influence of power interruption, such control saves the need of copying data in a data block into a new block already erased, thus allowing the number of times rewriting is performed to be reduced. Thereby, the lifetime of the NAND flash memory can be increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system comprising:

a nonvolatile memory including a plurality of data blocks, each of which includes a plurality of pages ordered in a respective sequential order, the nonvolatile memory being configured to erase data by erasing one or more entire data blocks of the plurality of data blocks; and a controller configured to write data to the plurality of data blocks;

wherein for each block of the plurality of data blocks, the controller is configured to sequentially write data to the data block by writing data to pages in the data block according to the respective sequential order; wherein for each block of the plurality of blocks, a respective last page is a page in the data block that has been written last in the respective sequential order, and wherein for each block of the plurality of blocks, a respective first page is the page directly after the respective last page in the respective sequential order;

wherein the controller is configured to check whether the nonvolatile memory has been affected by power interruption;

wherein if a first data block does not include a page that has been incorrectly written by power interruption, the controller is configured to resume sequentially writing data to the first data block at the respective first page;

wherein if a first data block includes a page that has been incorrectly written by power interruption, the controller is configured to resume sequentially writing data to the first data block at a second page, the second page being a page that is at least two pages after the respective first page in the respective sequential order.

2. The memory system according to claim 1, wherein the controller confirms data in the first page and, when the first page is not in the erased state, determines that the nonvolatile memory has been affected by power interruption.

3. The memory system according to claim 2, wherein the controller invalidates the first page when the nonvolatile memory has been affected by power interruption.

4. The memory system according to claim 3, wherein
each page in the data block contains a bit to store a flag indicating whether or not it has been invalidated, and
the controller sets the flag when making the page invalid.

5. The memory system according to claim 3, wherein the controller creates a table of pages which have been invalidated and stores the table in a second data block.

6. The memory system according to claim 3, wherein the controller creates a table of pages which have been invalidated and additionally writes the table to the first data block.

7. The memory system according to claim 2, further comprising an ECC (error checking and correction) circuit which checks the presence or absence of errors in data in the first data block,
wherein the last page is the most significant page of written pages which do not contain an error.

8. The memory system according to claim 2, wherein the controller determines that the nonvolatile memory has not been affected by power interruption when the first page is in the erased state.

9. The memory system according to claim 1, wherein the controller verifies that data stored in the first page is correct.

10. The memory system according to claim 9, wherein, when the result of the verification indicates that the data is not correct, the controller writes the data to the second page.

11. A memory system comprising:
a nonvolatile memory including a plurality of blocks including a plurality of data blocks and a management block which stores information for the data blocks, each of the plurality of blocks including a plurality of pages ordered in a respective sequential order, the nonvolatile memory being configured to erase data by erasing one or more entire blocks of the plurality of blocks; and
a controller configured to write data to the plurality of blocks;

wherein for each block of the plurality of blocks, the controller is configured to sequentially write data to the block by writing data to pages in the block according to the respective sequential order; wherein for each block of the plurality of blocks, a respective last page is a page in the block that has been written last in the respective sequential order, and wherein for each block of the plurality of blocks, a respective first page is the page directly after the respective last page in the respective sequential order;

wherein the controller is configured to check whether the nonvolatile memory has been affected by power interruption;

wherein if the management block does not include a page that has been incorrectly written by power interruption, the controller is configured to resume sequentially writing management information to the management block at the respective first page;

wherein if the management block includes a page that has been incorrectly written by power interruption, the controller is configured to resume sequentially writing management information to the management block at a second page, the second page being a page that is at least two pages after the respective first page in the respective sequential order.

12. The memory system according to claim 11, wherein, when data in the data blocks are rewritten, the controller additionally writes updated management information to the management block.

13. The memory system according to claim 11, wherein the controller confirms data in the first page and, when the first page is not in the erased state, determines that the nonvolatile memory has been affected by power interruption.

14. The memory system according to claim 13, wherein the controller invalidates the first page when the nonvolatile memory has been affected by power interruption.

15. The memory system according to claim 11, further comprising an ECC (error checking and correction) circuit which checks the presence or absence of errors in data in the management block,
wherein the last page is the most significant page of written pages which do not contain an error.

16. The memory system according to claim 11, wherein the controller determines that the nonvolatile memory has not been affected by power interruption when the first page is in the erased state.

* * * * *